(12) United States Patent
Sze

(10) Patent No.: US 7,191,423 B1
(45) Date of Patent: Mar. 13, 2007

(54) METHOD AND APPARATUS FOR FOLDING AND LAYING OUT ELECTRONIC CIRCUIT

(75) Inventor: Tom Sze, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 400 days.

(21) Appl. No.: 10/856,502

(22) Filed: May 28, 2004

(51) Int. Cl.
*G06F 17/50* (2006.01)

(52) U.S. Cl. ...................... 716/10; 716/2; 716/8; 716/9

(58) Field of Classification Search .................. 716/10, 716/9, 8, 2
See application file for complete search history.

(56) References Cited

U.S. PATENT DOCUMENTS 3,999,214 A * 12/1976 Cass ........................... 257/210
2004/0078768 A1* 4/2004 McGuinness et al. ........... 716/8

OTHER PUBLICATIONS

A. Gupta et al., "*Optimal 2-D Cell Layout with Integrated Transistor Folding*", 1998 ACM Intel Corporation, pp. 1-8.

J. Kim et al., "*An Efficient Transistor Folding Algorithm for Row-Based CMOS Layout Design*", Association for Computing Machinery, Inc., 1997, pp. 1-4.

* cited by examiner

Primary Examiner—Sun James Lin
(74) Attorney, Agent, or Firm—Gunnison, McKay & Hodgson, L.L.P.; Philip J. McKay

(57) ABSTRACT

A method and apparatus folds a circuit having a plurality of transistors. The folding includes: (a) determining a number of folds to realize a desired layout of the circuit based on a netlist of the circuit, a folded circuit having a number of fingers corresponding to the number of folds; (b) creating a single-finger layout for the circuit, the single-finger layout including a respective smaller transistor for each of the original transistors, each of the smaller transistors having a size which is an original size of the corresponding original transistor divided by the number of the fingers, the smaller transistors in the single-finger layout having an arrangement the same as an original arrangement of the original transistors in the circuit; and (c) tiling the single-finger layout for the number of folds such that each single-finger layout abuts an adjacent single-finger layout.

22 Claims, 14 Drawing Sheets

| Number of Fingers | Number of P/N Pairs | Number of Possible Arrangements |
|---|---|---|
| 1 | 2 | 2 (2!) |
| 2 | 4 | 24 (4!) |
| 3 | 6 | 720 (6!) |

METHOD AND APPARATUS FOR FOLDING AND LAYING OUT ELECTRONIC CIRCUIT

FIELD OF THE INVENTION

The present invention relates to layout synthesis for an integrated circuit design. More particularly, the present invention relates to a method and apparatus for laying out a circuit in a desired aspect ratio.

BACKGROUND OF THE INVENTION

FIG. 1 schematically illustrates a conventional layout synthesis process for a circuit design. Typically, the input source for layout synthesis is a netlist which describes the inputs, outputs, transistor sizes, and interconnects among the transistors of the circuit. As shown in FIG. 1, the input source is read in order to analyze and optimize the circuit layout under given constraints (100). The number of required or desirable folds is determined (101), and large transistors are folded or divided into smaller, typically equal-sized transistors (102). Folding is done to fit the transistors into an allotted space having a specific aspect ratio or to improve their electrical characteristics. The design constraints may include, for example, bounds on width, height, aspect ratio, and/or maximum size of transistors. The smaller transistors created by the folding process are sometimes referred to as "legs" or "fingers." In the conventional transistor folding, the legs/fingers of a folded transistor are connected in parallel, and are typically placed continuously with diffusion sharing in the cell layout. After the folding, all of the fingers are placed and routed (104), and then ports are added (106). The port-adding step may include pin shapes and/or labels.

FIG. 2A schematically illustrates a 2-way NAND circuit 10 including four (4) transistors (N1, N2, P1, P2). Connectivity of the transistors in the circuit is depicted by positions of vias (contact points) for the source (S), drain (D), and gate (G) of each transistor and their interconnects which are to be implemented by corresponding metal layers. The actual physical layout of each transistor is schematically illustrated in FIG. 2B. As described above, in accordance with the conventional transistor folding process, each transistor of the circuit is folded into two or more smaller transistors. FIGS. 3A–3C schematically illustrate an example of the original and folded transistors. A large transistor 12 (shown in FIG. 3A) can be folded into two legs or fingers 14, as shown in FIG. 3B, or three legs/fingers 16, as shown in FIG. 3C. FIGS. 3A–3C also illustrates a corresponding schematic circuit for the original and folded transistors. The folded transistor (legs) may be flipped such that the source and drain replace each other.

FIG. 4A schematically illustrates an example where each transistor of the 2-way NAND circuits 10 is folded into two legs. Each of the original transistor, for example, N1 in FIG. 2A, is divided into two smaller transistors N1$a$ and N1$b$. Assume each of the original transistors in the NAND circuit 10 has an aspect ratio (X:Y) of 6:1, and thus the NAND circuit 10 has that of 12:2. Then, for example, a folded transistor 20 has an aspect ratio of 3:2 with two legs N1$a$ and N1$b$ each having an aspect ratio of 3:1. Similarly, the original transistors N2, P1, and P2 in the NAND circuit 10 are folded into equivalent transistors 22, 24, and 26, respectively. Thus, the resulting NAND circuit 28 with the folded transistors has an aspect ratio of 6:4. FIG. 4B schematically illustrates another example of a NAND circuit 38 with folded transistors 30, 32, 34, and 36, where each of the original transistors in the 2-way NAND circuits 10 is folded into three legs. In this case, the NAND circuit 38 has an aspect ratio of 4:6 different from that of the NAND circuit 28.

The conventional transistor folding multiplies both the transistor count and the connection count by the number of folds. As a result, the complexity of the problem to place and route all of the fingers grows geometrically. Actually, the relationship between the number of folds and the complexity is factorial. For example, in the case of the 2-way NAND circuit, there are four (4) transistors including two (2) P/N pairs: a first pair (N1 and P1) and a second pair (N2 and P2), in its original (unfolded) sate as shown FIG. 2A. Thus, there are two possible arrangements of the devices when two things are taken from among two things, as shown in FIG. 4C. This is mathematically expressed as 2! (2 factorial)=2× 1=2. When each transistor of the NAND circuit is folded into two fingers, the folded NAND circuit includes eight (8) transistors, or four (4) P/N pairs as shown in FIG. 4A. Thus, the number of possible arrangements is 4!=4×3×2×1=24. The number of possible arrangements grows rapidly as the number of fold increases as shown in FIG. 4D.

Thus, in general, the relationship between the number of fingers and the number of possible arrangements are expressed as follows:

$$A=(F \times W)!$$

where A is the number of possible arrangements, F is the number of fingers, and W is a weight factor depending on the circuit type. For example, W is 1 for inverter, 2 for 2-way NAND or 2-way gates, for 3-way NAD or 3-way gates, and the like.

Since simply folding each transistor into multiple fingers does not yield an optimal placement for the circuit, the problem is to determine which one of the possible transistor arrangements, for example, 24 in a once-folded NAND circuit, is optimal. Such determination requires complicated placing algorithm and routing algorithm. Various placement algorithms have been proposed to handle the situation, including one using annealing techniques.

BRIEF DESCRIPTION OF THE INVENTION

A method and apparatus folds a circuit having a plurality of transistors. The folding includes (a) determining a number of folds to realize a desired layout of the circuit based on a netlist of the circuit, a folded circuit having a number of fingers corresponding to the number of folds, (b) creating a single-finger layout for the circuit, the single-finger layout including a respective smaller transistor for each of the original transistors, each of the smaller transistors having a size which is an original size of the corresponding original transistor divided by the number of the fingers, the smaller transistors in the single-finger layout having an arrangement the same as an original arrangement of the original transistors in the circuit, and (c) tiling the single-finger layout for the number of folds such that each single-finger layout abuts an adjacent single-finger layout.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
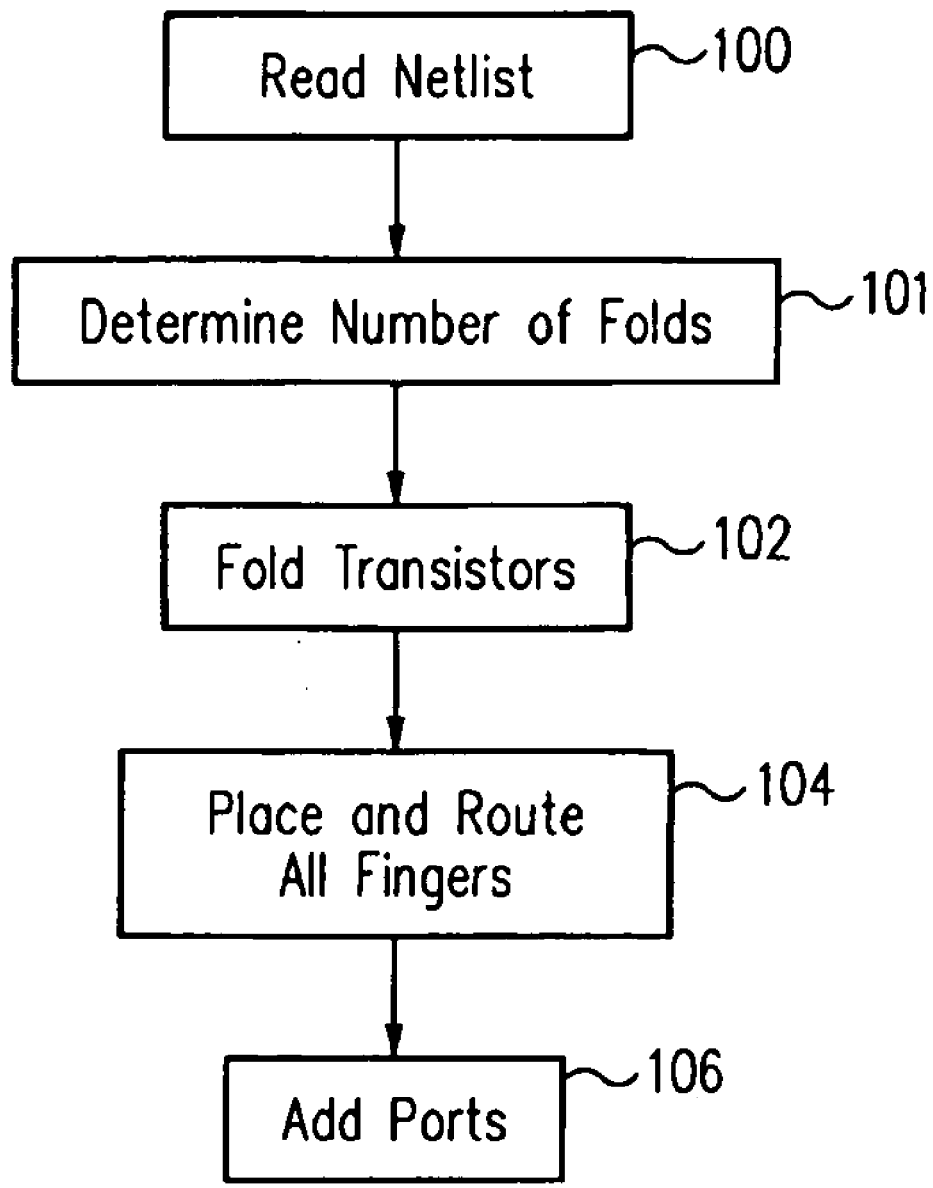
FIG. 1 is a process flow diagram schematically illustrating a conventional layout synthesis process.
Figure 2A:
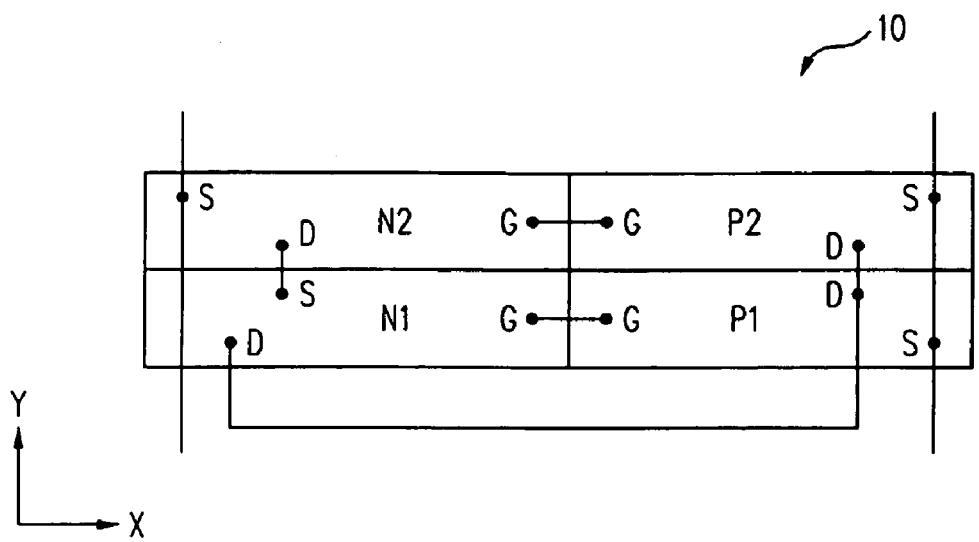
FIG. 2A is a diagram schematically illustrating a 2-way NAND circuit including four (4) transistors.
Figure 2B:
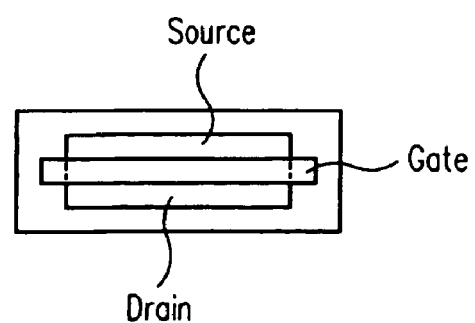
FIG. 2B is a diagram schematically illustrating an actual physical layout of each transistor shown in FIG. 2A.
Figure 3A:
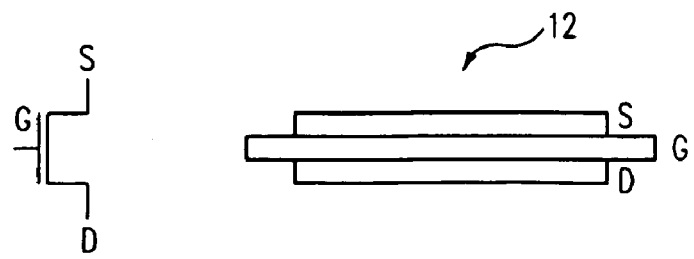
FIG. 3A is a diagram schematically illustrating a large transistor to be folded and a corresponding schematic circuit thereof.
Figure 3B:
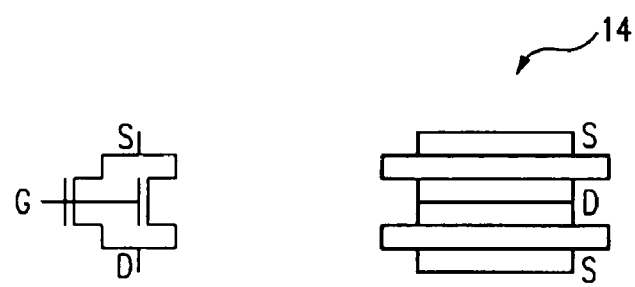
FIG. 3B is a diagram schematically illustrating a folded transistor having two legs in a conventional transistor folding and a corresponding schematic circuit thereof.
Figure 3C:
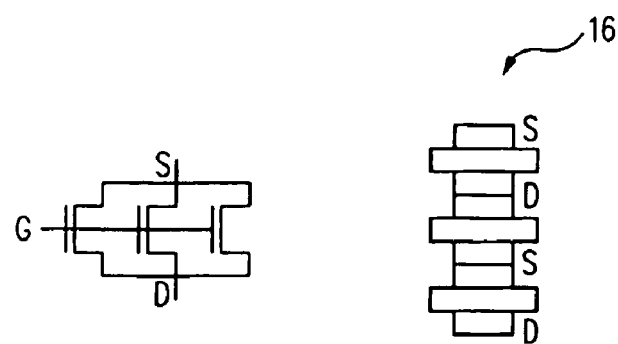
FIG. 3C is a diagram schematically illustrating a folded transistor having three legs in a conventional transistor folding and a corresponding schematic circuit thereof.
Figure 4A:
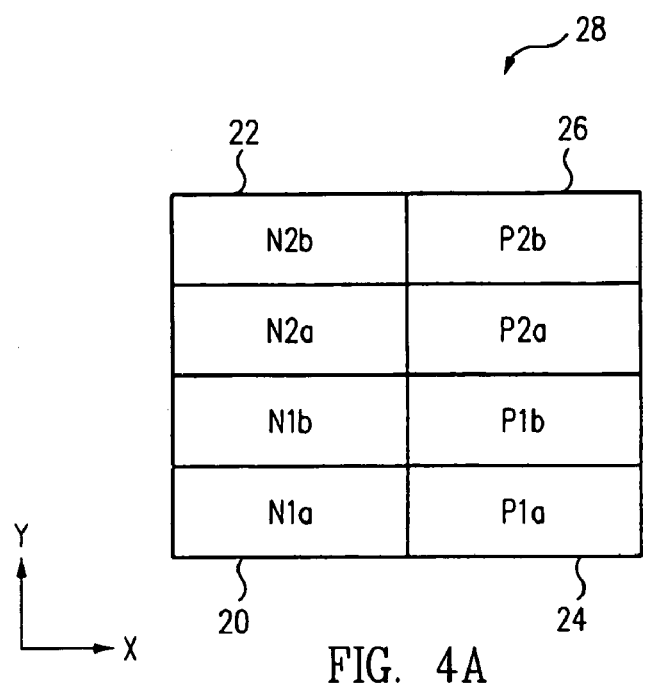
FIG. 4A is a diagram schematically illustrating an example of a 2-way NAND circuit where each transistor is folded into two legs using the conventional transistor folding.
Figure 4B:
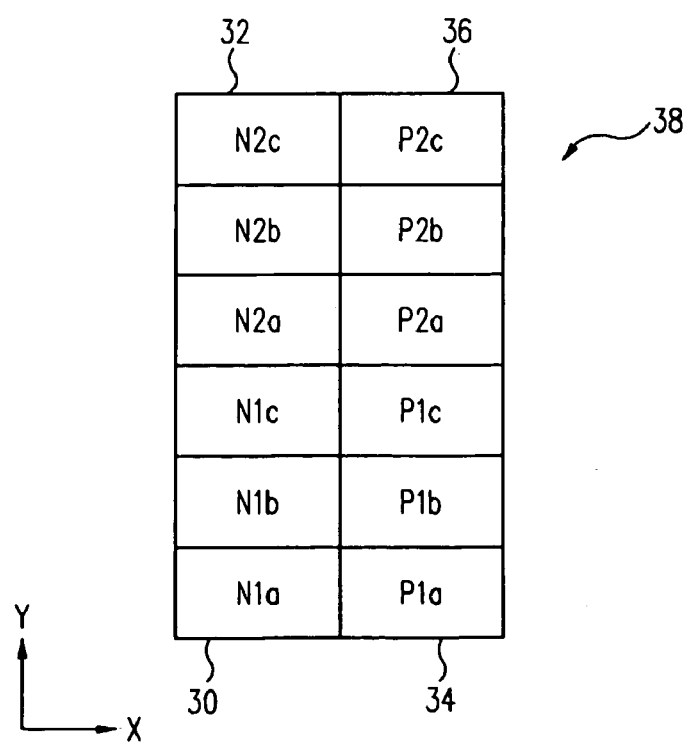
FIG. 4B is a diagram schematically illustrating an example of a 2-way NAND circuit where each transistor is folded into three legs using the conventional transistor folding.
Figures 4C, 4D:
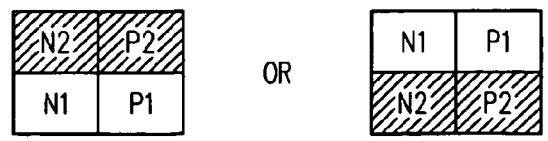
FIG. 4C is a diagram schematically illustrating an example of possible transistor arrangements in a 2-way NAND circuit.
FIG. 4D is a tabular diagram showing an example of the number of possible arrangements growing rapidly as the number of fold increases.

Embodiments of the present invention are described herein in the context of a method and apparatus for folding and laying out an electronic circuit. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available form Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 5:
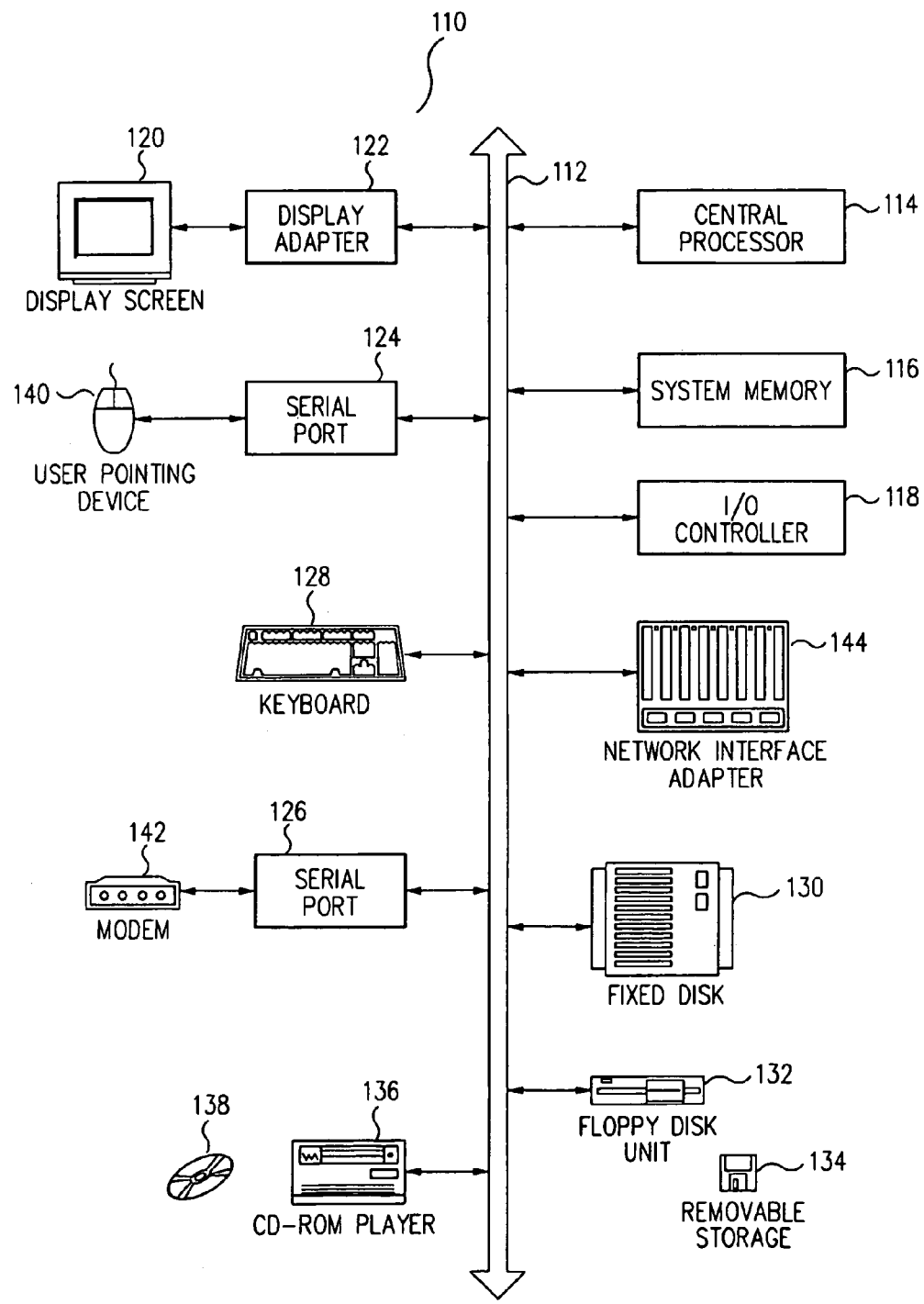
FIG. 5 is a block diagram schematically illustrating a computer system suitable for implementing aspects of the present invention.

FIG. 5 depicts a block diagram of a computer system 110 suitable for implementing aspects of the present invention. As shown in FIG. 5, computer system 110 includes a bus 112 which interconnects major subsystems such as a central processor 114, a system memory 116 (typically RAM), an input/output (I/O) controller 118, an external device such as a display screen 120 via display adapter 122, serial ports 124 and 126, a keyboard 128, a fixed disk drive 130, a floppy disk drive 132 operative to receive a floppy disk 134, and a CD-ROM player 136 operative to receive a CD-ROM 138. Many other devices can be connected, such as a pointing device 140, (e.g., a mouse) connected via serial port 124 and a modem 142 connected via serial port 126. Modem 142 may provide a direct connection to a remote server via a telephone link or to the Internet via a POP (point of presence). Alternatively, a network interface adapter 144 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 5 to be present to practice the present invention, as discussed below. Furthermore, the devices and subsystems may be interconnected in different ways from that shown in FIG. 5. The operation of a computer system such as that shown in FIG. 5 is readily known in the art and is not discussed in detail in this application, so as not to overcomplicate the present discussion. Code to implement the present invention may be operably disposed in system memory 116 or stored on storage media such as fixed disk 130, floppy disk 134 or CD-ROM 138.

Figure 6:
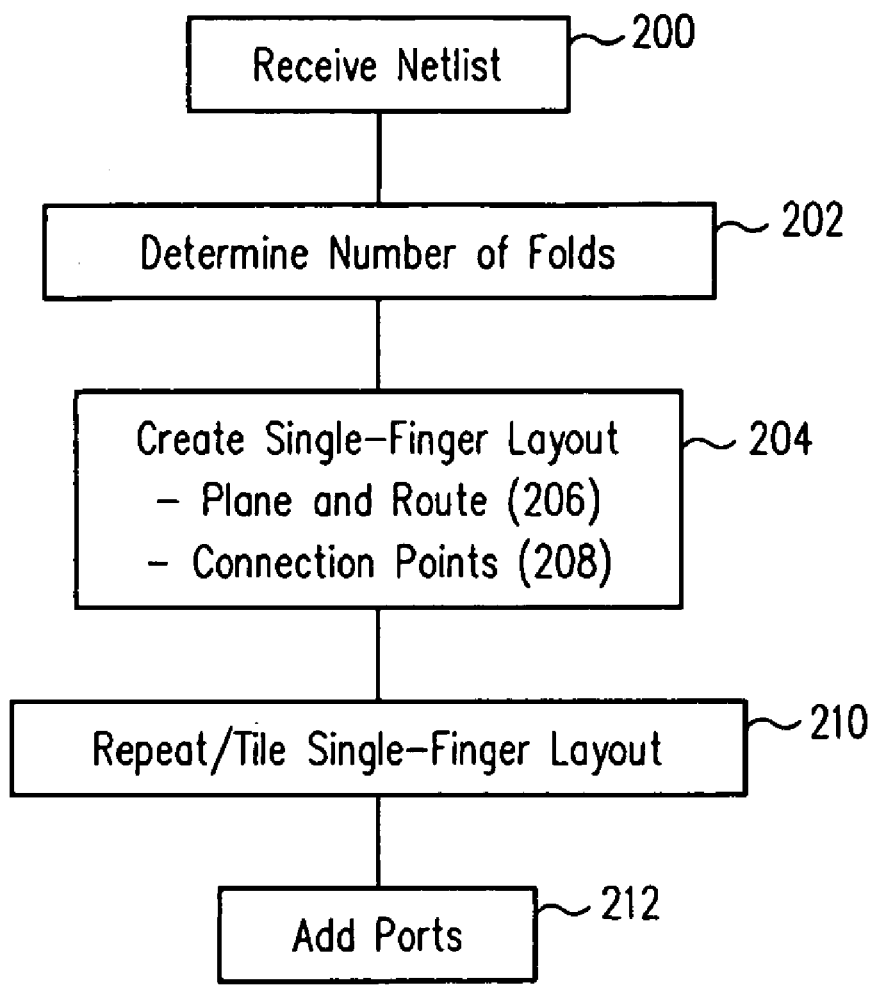
FIG. 6 is a process flow diagram schematically illustrating a method for laying out a circuit in a desired aspect ratio in accordance with one embodiment of the present invention.

FIG. 6 schematically illustrates a method for folding a circuit in accordance with one embodiment of the present invention. The circuit including a plurality of transistors, and is typically described as a netlist which includes information describing inputs, outputs, transistor sizes, and interconnectivity of the transistors. As shown in FIG. 6, the netlist of the circuit may be received and read as an input source (200). For example, a 2-way NAND circuit 40 includes four transistors 42, 44, 46, and 48, as sown in FIG. 7A, and the corresponding netlist includes all information of the size (and thus aspect ratio) of each of the original transistors, and connectivity among the inputs and outputs, the sources, drains, and gates of the transistors. FIG. 7B further depicts the connectivity of the transistors in the NAND circuit 40. In FIG. 7B, the gate, source, and drain of the finger transistors are shown as their via locations (G, S, D, respectively), and the interconnects among them (solid lines) are to be implemented by metal layers.

The circuit is analyzed, for example, to optimize placement under given constraints or specification, and the number of folds to realize an optimal placement of the circuit is determined (202). For example, such an optimal placement includes a desired aspect ratio of the circuit. As described above, each of the original transistors in the circuit are to be folded into that number of smaller transistors which are, together, equivalent in a device size to the original transistor. In this process, however, the transistors are not actually folded, but only the number of the folds is determined. The folded circuit has the number of fingers corresponding to the number of folds.

Then, a single-finger layout for the circuit is created (204). The single-finger layout includes a respective smaller transistor for each of the original transistors, and each of the smaller transistors has a size which is an original size of the corresponding original transistor divided by the number of the fingers. The smaller transistors in the single-finger layout has an arrangement the same as the original arrangement of the original transistors in the circuit. In other words, the single-finger layout includes one smaller transistor for each of the corresponding original transistors, and the smaller transistors in the single-finger layout preserve the interconnectivity of the original transistors. The single-finger layout is also referred to as a "tile."

Figure 7A:
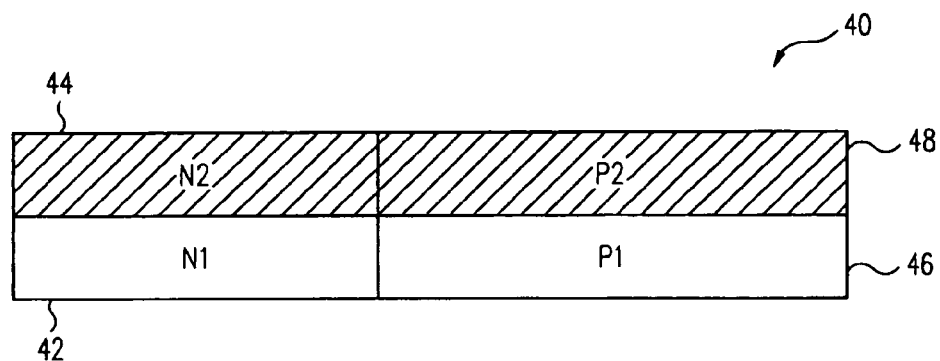
FIG. 7A is a diagram schematically illustrating an example of a 2-way NAND circuit including four (4) transistors to be folded in accordance with one embodiment of the present invention.
Figure 7B:
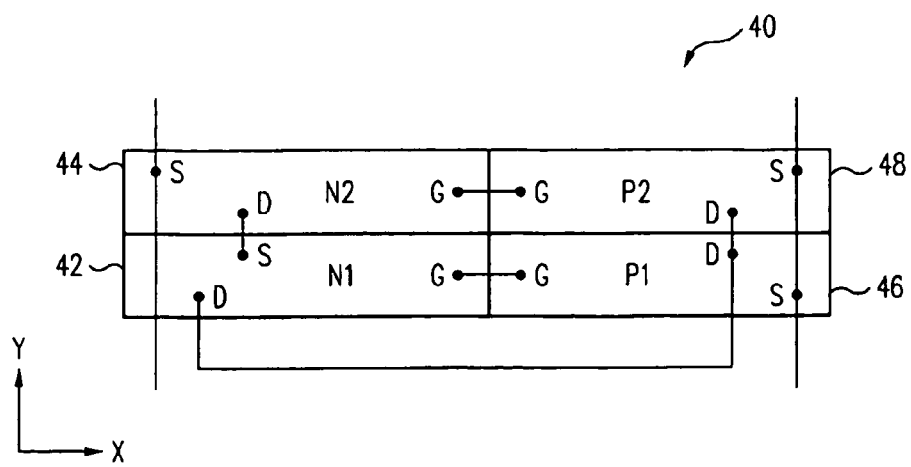
FIG. 7B is a diagram schematically illustrating the 2-way NAND circuit of FIG. 7A with connectivity among the transistors.
Figure 8A:
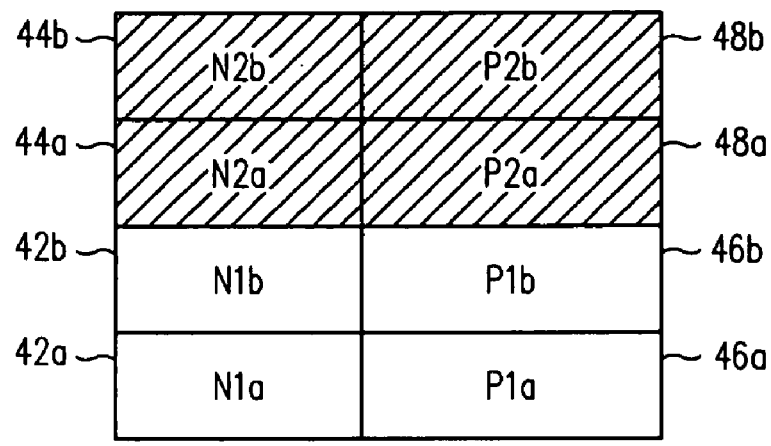
FIG. 8A is a diagram schematically illustrating an example of a single-finger layout in accordance with the conventional transistor folding.
Figure 8B:
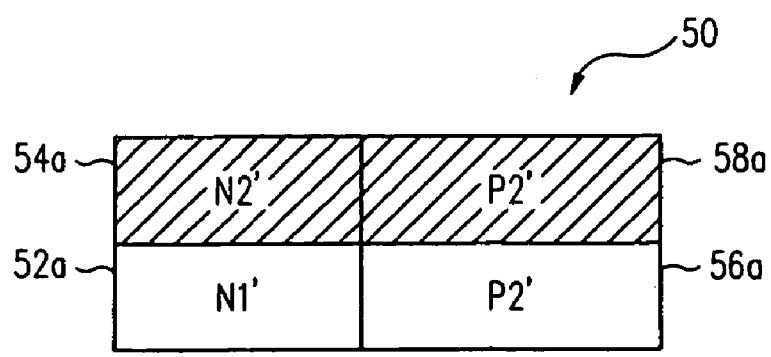
FIG. 8B is a diagram schematically illustrating an example of a single-finger layout which includes one corresponding finger (smaller transistor) for each of the original transistors in accordance with one embodiment of the present invention.

For example, FIG. 7A shows an original NAND circuit 40 including N-type transistors N1 and N2 (42 and 44) and P-type transistors P1 and P2 (46 and 48) with device sizes of 6 μm and 8 μm, respectively. The devices are arranged in two lines (one P/N pair per line). When the NAND circuit 40 is to be folded into to two fingers, in prior art, the transistors 42, 44, 46, and 48 are individually folded into two smaller transistors 42a and 42b, 44a and 44b, 46a and 46b, and 48a and 48b, respectively, as shown in FIG. 8A. The folded devices are arranged in four lines (one P/N pair per line). As discussed above, there are 24 ways to arrange the four PIN pairs in the prior art, and placement algorithms and simulations are required to find an optimum solution. However, in accordance with one embodiment of the present invention, a single-finger layout 50 is created such that the original transistor arrangement is preserved for each smaller transistor. That is, smaller transistors N1', N2', P1', and P2' (52a, 54a, 56a, and 58a) corresponding to the original transistors N1, N2, P1, and P2 (42, 44, 46, and 48) are defined such that each smaller transistor has a size which is an original size divided by the number of the fingers, and the single-finger layout has one corresponding smaller transistor for each of the original transistors. For example, if the original circuit having N-type (6 μm) and P-type (8 μm) transistors is folded into two fingers, the single-finger layout has the smaller N-type and P-type transistors with device sizes 3 μm and 4 μm, respectively. As mentioned above, the smaller transistors in the single-finger layout have an arrangement (topology) that is the same as the original arrangement of the original transistors.

Figure 8C:
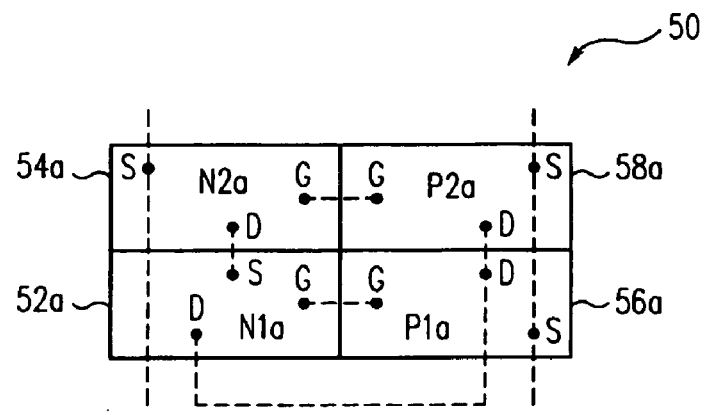
FIG. 8C is a diagram schematically illustrating the single-finger layout of FIG. 8B with connectivity among the transistors.

Referring back to FIG. 6, in this single-finger layout 50, the transistors are placed and routed in accordance with that of the original transistor layout (206). Since the connectivity among the transistors is already known, no routing/placement algorithm is necessary. FIG. 8C schematically illustrates the single-finger layout 50 which preserves the connectivity among the transistors in the original circuit layout 40 (FIG. 7B). In FIG. 8C, the gate, source, and drain of the finger transistors are shown as their via locations (G, S, D, respectively), and the interconnects among them are shown as broken lines which are to be implemented by metal layers. It should be noted that the "same connectivity" includes a mirror image of the original connectivity.

Figure 9:
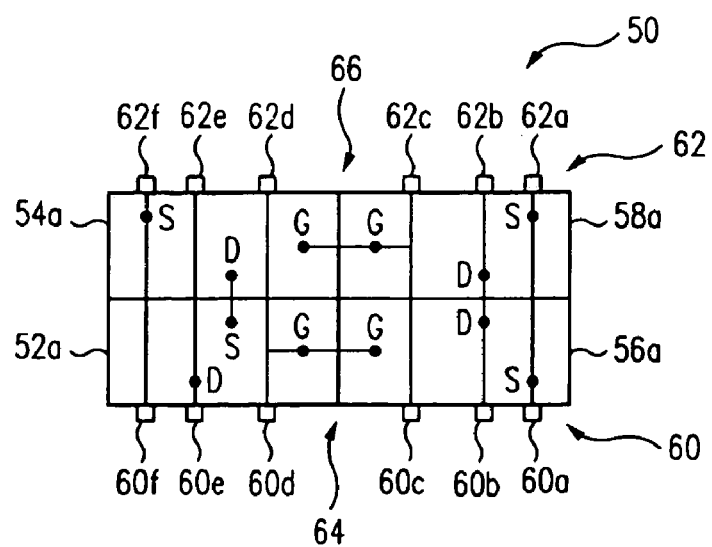
FIG. 9 is a diagram schematically illustrating the single-finger layout provided with connection points at selected locations on the abutting sides in accordance with one embodiment of the present invention.

In addition, as shown in FIG. 9, source (S), drain (D), and gate (G) connection points 60 (60a, 60b, 60c, ...) and 62 (62a, 62b, 62c, ...) are provided at selected locations on the corresponding abutting sides 64 and 66 of the single-finger layout 50 (208). For example, connection points 60*a* and 62*a* for connecting the sources (S) of the transistors 56*a* and 58*a* are provided on the abutting sides 64 and 66, respectively. For drains (D) of the transistors 52*a*, 56*a*, and 58*a*, which are to be interconnected as shown in FIG. 8C, four (4) connection points 60*b*, 60*e*, 62*b*, and 62*e* are provided on the abutting sides 64 and 66. Similarly, two connected gates (G) of the transistors 54*a* and 58*a* have connection points 60*c* and 62*c* on the abutting sides 64 and 66, respectively, and connected gates (G) of the transistors 52*a* and 56*a* have connection points 60*d* and 62*d* on the abutting sides 64 and 66, respectively, and so on. It should be noted that each of the connection points 60 on one abutting side 64 has its counter part 62 on the other abutting side 66. That is, the connection points, or ports, of the single-finger layout ("tile") are brought out to the edges of the single-finger layout such that the tiles can be connected each other by abutment.

Figure 10A:
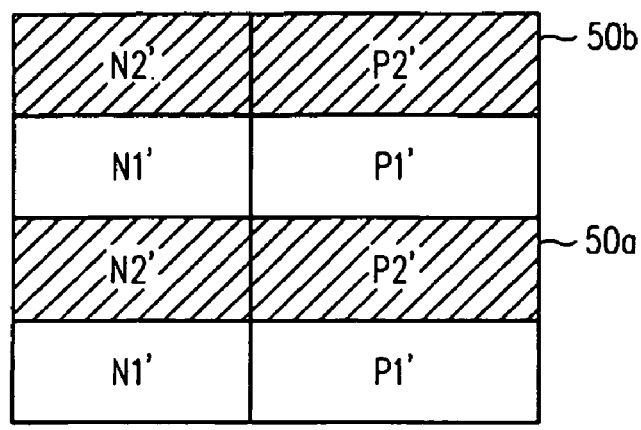
FIG. 10A is a diagram schematically illustrating an example of tiled single-fingers in accordance with one embodiment of the present invention.
Figure 10B:
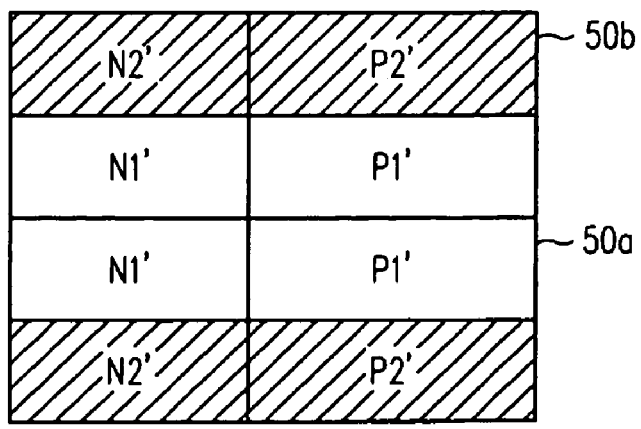
FIG. 10B is a diagram schematically illustrating another example of tiled single-fingers in accordance with one embodiment of the present invention.
Figure 10C:
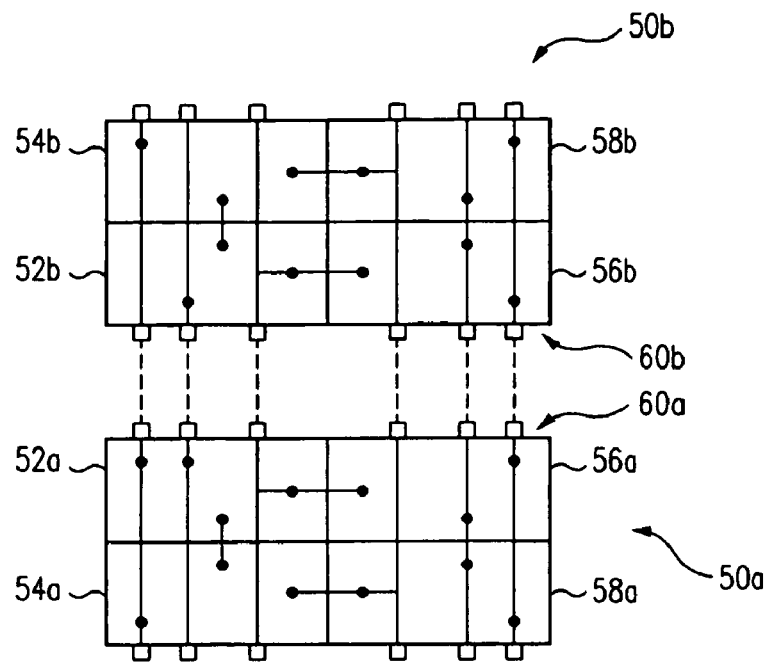
FIG. 10C is a diagram schematically illustrating the connection between the single-finger layouts in accordance with one embodiment of the present invention.
Figure 10D:
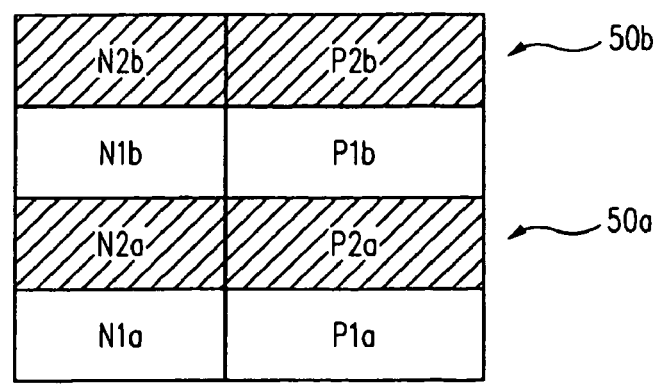
FIG. 10D is a diagram schematically illustrating an example of tiled single-fingers in accordance with one embodiment of the present invention for comparison with the conventionally folded transistors shown in FIG. 8A.

Referring back to FIG. 6, the single-finger layout 50 are repeated for the number of folds, i.e., "tiled," such that each single-finger layout abuts an adjacent single-finger layout (210). FIG. 10A schematically illustrates tiled single-fingers 50*a* and 50*b*. The single-finger layout 50 works as a "unit," and are replicated and tiled by the number of folds as determined in process 202 above. As shown in FIG. 10B, the second single-finger layout 50*b* may be flipped, or be a mirror image of the first single-finger layout 50*a*. The second single-finger layout 50*b* has to be a replica of the first single-finger layout 50*a* but not necessarily a mirror image of the first single-finger layout 50*a*. However, in most cases, the overall layout is denser when the second single-finger layout (or every other unit in the tiling) is the mirror image of the first. If the original circuit layout is symmetrical, there is no need to use a mirror image because the both are identical. FIG. 10C schematically illustrates an example of connecting two single-finger layouts 50*a* and 50*b* in the tiling process. As shown in FIG. 10C, the connection points 60*a* is coupled to the corresponding connection point 60*b* by abutting. Since single-finger layouts are connected by simply abutting each other, there is no need to solve the optimal placement and routing problems in the folded circuit. Compared with the conventional transistor folding (FIG. 8A), in one embodiment of the present invention, an optimal placement is given by gathering all of the "a" transistors (i.e., N1*a*, P1*a*, etc.) for a first finger, and then all of the "b" transistors (i.e., N1*b*, P1*b*, etc.) for the next finger, and the like, as shown in FIG. 10D.

Figure 11:
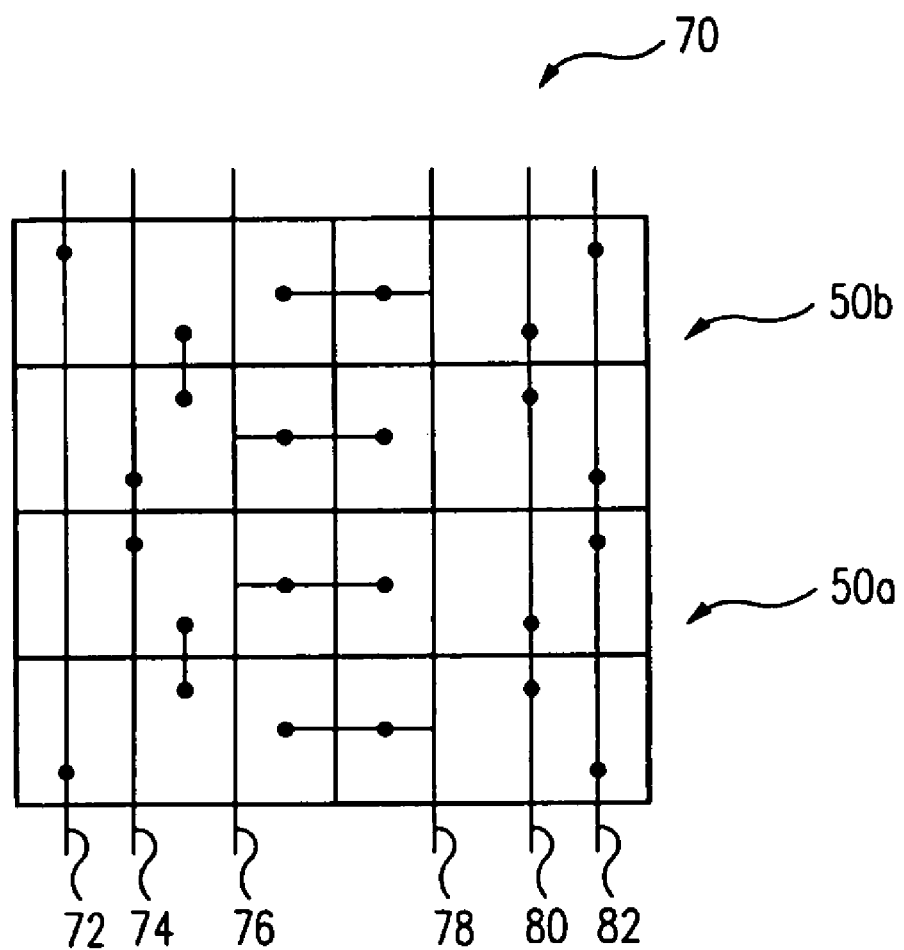
FIG. 11 is a diagram schematically illustrating an example of the folded circuit having two units of the single-finger layout in accordance with one embodiment of the present invention.

FIG. 11 schematically illustrates the resulting folded circuit 70 (with the number of folds of 2) including the first tile (single-finger layout) 50*a* and a second tile (single-finger layout) 50*b* abutting the first unit 50*a*. The transistor layout of the first unit 50*a* and the transistor layout of the second unit 50*b* have the same connectivity. The metal layers for each tile are connected at the connection points so as to form common metal layers 72, 74, 76, 78, 80, and 82 running across the tiles 50*a* and 50*b*. Then, referring back to FIG. 6, ports are added to the folded and laid-out circuit (212).

Figure 12:
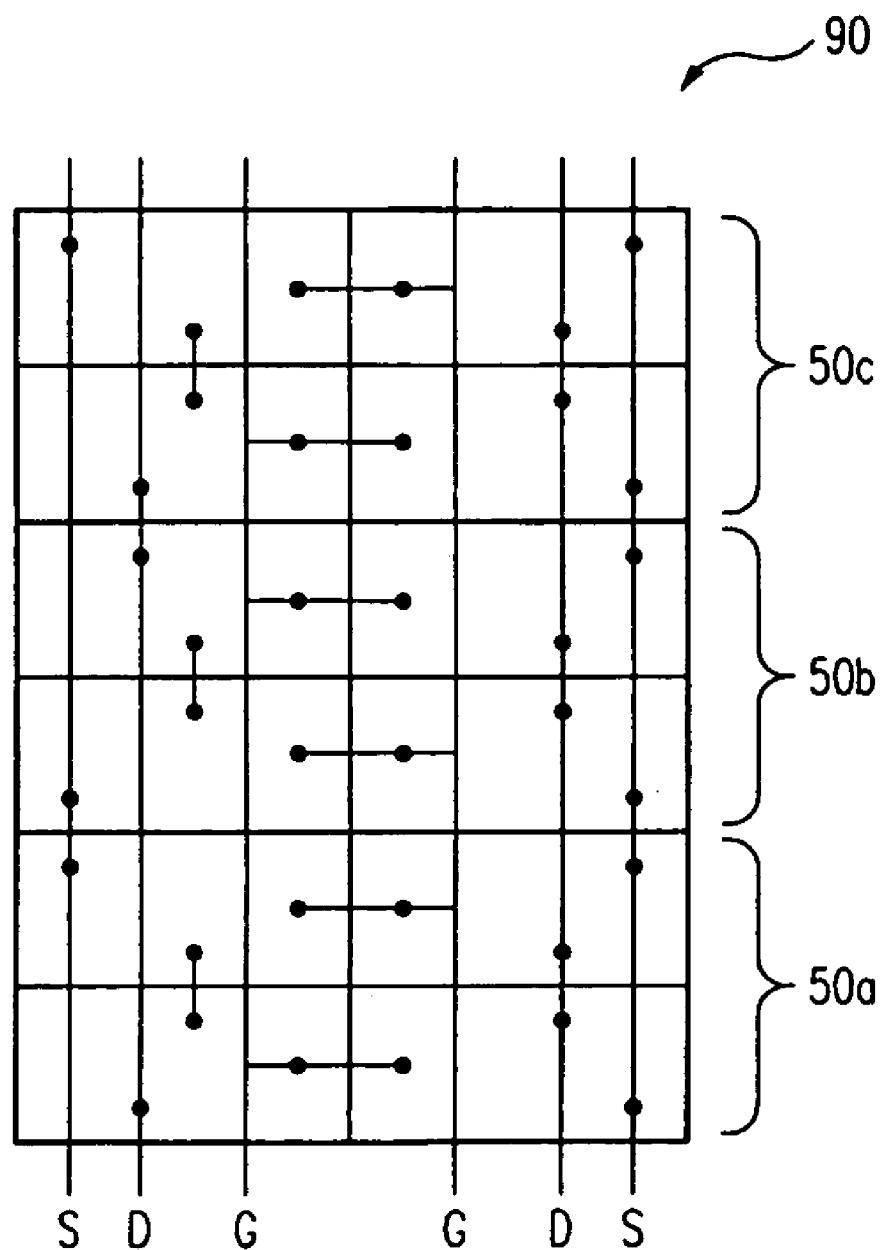
FIG. 12 is a diagram schematically illustrating an example of the folded circuit having three units of the single-finger layout in accordance with one embodiment of the present invention.

FIG. 12 schematically illustrates another example of a folded circuit 90 for the 2-way NAND circuit where the number of folds are three (3). As shown in FIG. 12, the folded circuit 90 includes three single-finger units 50*a*, 50*b*, and 50*c* among which the single-finger 50*b* is flipped. The flipped (mirror-imaged) and non-flipped (original) single-finger layouts may alternately placed for a denser overall layout. As mentioned above, the number of folds may be any desired number, and the folded circuit can be obtained by simply replicating or tiling the single-finger unit by that number.

As described above, in accordance with embodiments of the present invention, by bringing the connection points of the single-finger layout (unit) to the abutting sides (or edge) of the single-finger layout, connections between the unit are accomplished by abutment. Thus, in accordance with embodiments of the present invention, since the place and route problem has already been solved for the single-finger layout, the increase in transistor counts due to folding process only multiplies the number of the units (single-finger layout) to be tiled, while the number of folds geometrically increases the place and rout complexity in the conventional transistor folding.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for folding a circuit, the circuit including a plurality of transistors, said method comprising:
determining a number of folds to realize a desired layout of the circuit based on a netlist of the circuit, a folded circuit having a number of fingers corresponding to the number of folds;
creating a single-finger layout for the circuit, the single-finger layout including a respective smaller transistor for each original transistor, each of the smaller transistors having a size which is an original size of a corresponding original transistor divided by the number of the fingers, the smaller transistors in the single-finger layout having an arrangement the same as an original arrangement of the original transistors in the circuit; and
tiling the single-finger layout for the number of folds such that each single-finger layout abuts an adjacent single-finger layout.

2. The method of claim 1, further comprising:
receiving a netlist for the circuit, the netlist comprising information describing inputs, outputs, size of the original transistors, and interconnectivity of the inputs, outputs, and original transistors.

3. The method of claim 1, wherein the desired layout of the circuit includes a desired aspect ratio of the circuit.

4. The method of claim 1, further comprising:
providing ports to the folded circuit.

5. The method of claim 1, wherein said creating comprises:
placing and routing the smaller transistors in the single-finger layout in accordance with an original layout of the original transistors in the circuit.

6. The method of claim 5, wherein said creating further comprises:
providing connection points for the smaller transistors at selected locations on abutting sides of the single-finger layout.

7. The method of claim 1, wherein said tiling comprising:
mirror-imaging every other single-finger layout.

8. A circuit cell in an integrated circuit, said circuit cell comprising:
a first unit having a first layout of transistors; and a second unit abutting the first unit, said second unit having a second layout of transistors, the second layout having same connectivity of the transistors as that of the first layout wherein said first unit includes source, drain, and gate connection points at selected locations on a side abutting the second unit, and wherein said second unit includes source, drain, and gate connection points at corresponding locations on a side abutting the first unit such that the connection points of the second unit abut corresponding connection points of the first unit.

9. An apparatus for folding a circuit, the circuit including a plurality of transistors, said apparatus comprising:

means for determining a number of folds to realize a desired layout of the circuit based on a netlist of the circuit, a folded circuit having a number of fingers corresponding to the number of folds;

means for creating a single-finger layout for the circuit, the single-finger layout including a respective smaller transistor for each original transistor, each of the smaller transistors having a size which is an original size of a corresponding original transistor divided by the number of the fingers, the smaller transistors in the single-finger layout having an arrangement the same as an original arrangement of the original transistors in the circuit; and means for tiling the single-finger layout for the number of folds such that each single-finger layout abuts an adjacent single-finger layout.

10. The apparatus of claim 9, further comprising:

means for receiving a netlist for the circuit, the netlist comprising information describing inputs, outputs, size of the original transistors, and interconnectivity of the inputs, outputs, and original transistors.

11. The apparatus of claim 9, wherein the desired layout of the circuit includes a desired aspect ratio of the circuit.

12. The apparatus of claim 9, further comprising:

means for providing ports to the folded circuit.

13. The apparatus of claim 9, wherein said means for creating comprises:

means for placing and routing the smaller transistors in the single-finger layout in accordance with an original layout of the original transistors in the circuit.

14. The apparatus of claim 13, wherein said means for creating further comprises:

means for providing connection points for the smaller transistors at selected locations on abutting sides of the single-finger layout.

15. The apparatus of claim 9, wherein said means for tiling comprising:

means for mirror-imaging every other single-finger layout.

16. A program storage device readable by a machine, tangibly embodying a program of instructions executable by the machine to perform a method for folding a circuit, the circuit including a plurality of transistors, said method comprising:

determining a number of folds to realize a desired layout of the circuit based on a netlist of the circuit, a folded circuit having a number of fingers corresponding to the number of folds;

creating a single-finger layout for the circuit, the single-finger layout including a respective smaller transistor for each original transistor, each of the smaller transistors having a size which is an original size of a corresponding original transistor divided by the number of the fingers, the smaller transistors in the single-finger layout having an arrangement the same as an original arrangement of the original transistors in the circuit; and tiling the single-finger layout for the number of folds such that each single-finger layout abuts an adjacent single-finger layout.

17. The program storage device of claim 16, wherein said method further comprises:

receiving a netlist for the circuit, the netlist comprising information describing inputs, outputs, size of the original transistors, and interconnectivity of the inputs, outputs, and original transistors.

18. The program storage device of claim 16, wherein the desired layout of the circuit includes a desired aspect ratio of the circuit.

19. The program storage device of claim 16, wherein said method further comprises:

providing ports to the folded circuit.

20. The program storage device of claim 16, wherein said creating comprises:

placing and routing the smaller transistors in the single-finger layout in accordance with an original layout of the original transistors in the circuit.

21. The program storage device of claim 20, wherein said creating further comprises:

providing connection points for the smaller transistors at selected locations on abutting sides of the single-finger layout.

22. The program storage device of claim 16, wherein said tiling comprising:

mirror-imaging every other single-finger layout.

* * * * *